US008916860B2

(12) United States Patent
Lee et al.

(10) Patent No.: US 8,916,860 B2
(45) Date of Patent: Dec. 23, 2014

(54) ORGANIC LIGHT-EMITTING DEVICE COMPRISING FIRST ELECTRON TRANSPORT LAYER COMPRISING DMBI DERIVATIVE

(71) Applicants: Samsung Display Co., Ltd., Yongin-si (KR); Postech Academy-Industry Foundation, Pohang-si (KR)

(72) Inventors: Sun-Hee Lee, Yongin-si (KR); Won-Jun Song, Yongin-si (KR); Kwan-Hee Lee, Yongin-si (KR); Tae-Woo Lee, Pohang-si (KR); Min-Ho Park, Yongin-si (KR)

(73) Assignees: Samsung Display Co., Ltd., Yongin-si (KR); Postech Academy-Industry Foundation, Pohang-si (KR)

( * ) Notice: Subject to any disclaimer, the term of this patent is extended or adjusted under 35 U.S.C. 154(b) by 0 days.

(21) Appl. No.: 13/794,738

(22) Filed: Mar. 11, 2013

(65) Prior Publication Data

US 2014/0070178 A1  Mar. 13, 2014

(30) Foreign Application Priority Data

Sep. 7, 2012  (KR) .................. 10-2012-0099544

(51) Int. Cl.
| | | |
|---|---|---|
| *H01L 29/08* | (2006.01) | |
| *H01L 35/24* | (2006.01) | |
| *H01L 51/00* | (2006.01) | |
| *H01J 1/62* | (2006.01) | |
| *H01L 51/50* | (2006.01) | |
| *H01L 51/40* | (2006.01) | |

(52) U.S. Cl.
CPC .......... *H01L 51/5076* (2013.01); *H01L 51/508* (2013.01); *H01L 51/0085* (2013.01); *H01L 2251/308* (2013.01)
USPC ............. 257/40; 438/99; 313/500; 313/503

(58) Field of Classification Search
CPC ................................................... H01L 51/5076
See application file for complete search history.

(56) References Cited

U.S. PATENT DOCUMENTS

| | | | |
|---|---|---|---|
| 8,053,975 B2 | 11/2011 | Chun et al. | |
| 2008/0128686 A1* | 6/2008 | Kwon | 257/40 |
| 2010/0252823 A1* | 10/2010 | Kambe et al. | 257/40 |
| 2011/0198666 A1 | 8/2011 | Prakash et al. | |
| 2011/0220200 A1 | 9/2011 | Lessmann et al. | |
| 2011/0240980 A1 | 10/2011 | Wei et al. | |
| 2011/0248267 A1 | 10/2011 | Wei et al. | |
| 2011/0266525 A1 | 11/2011 | Lecloux et al. | |
| 2013/0001530 A1* | 1/2013 | Lim et al. | 257/40 |

FOREIGN PATENT DOCUMENTS

| | | | |
|---|---|---|---|
| KR | 10-0829761 | 5/2008 | |
| WO | WO2012/129791 | * 10/2012 | H01L 51/50 |

OTHER PUBLICATIONS

Wei, P. et al., "Use of a 1H-Benzoimidazole Derivative as an n-Type Dopant and To Enable Air-Stable Solution-Processed n-Channel Organic Thin-Film Transistors," 2010, J. Am. Chem. Soc. 132, pp. 8852-8853.*

* cited by examiner

*Primary Examiner* — Michael Jung
(74) *Attorney, Agent, or Firm* — Christie, Parker & Hale, LLP

(57) ABSTRACT

An organic light-emitting device including: a substrate; a transparent cathode on the substrate; an anode disposed opposite to the cathode; an emission layer between the cathode and the anode; and a first electron transport layer between the cathode and the emission layer and including an imidazole derivative.

18 Claims, 7 Drawing Sheets

ORGANIC LIGHT-EMITTING DEVICE COMPRISING FIRST ELECTRON TRANSPORT LAYER COMPRISING DMBI DERIVATIVE

CROSS-REFERENCE TO RELATED APPLICATION

This application claims priority to and the benefit of Korean Patent Application No. 10-2012-0099544, filed on Sep. 7, 2012, in the Korean Intellectual Property Office, the entire content of which is incorporated herein by reference.

BACKGROUND

1. Field

One or more embodiments of the present invention relate to an organic light-emitting device, for example, an organic light-emitting device having an electron transport layer including an n-dopant.

2. Description of the Related Art

Organic light-emitting devices are self-light emitting devices that emit light when a voltage is applied thereto, and offer high luminance, high contrast, multi-color reproduction, large viewing angle, quick response rate, and low driving voltage.

An organic light-emitting device has a structure including an organic emission layer between an anode and a cathode. Upon application of a voltage, holes from the anode and electrons from the cathodes are injected into the organic emission layer. The injected holes and electrons undergo electron exchanges in adjacent molecules in the organic emission layer, thereby migrating to opposite electrodes. Upon recombination of electrons and holes in the organic emission layer, molecular excitons in a high-energy excited state are generated. The molecular excitons emit light of inherent color upon returning to a low-energy ground state.

Active-matrix organic light emitting devices (AMOLEDs) may include thin film transistors (TFTs) using amorphous silicon or polycrystalline silicon. Polycrystalline silicon is advantageous in view of its high charge mobility and being available for both n-type TFTs and p-type TFTs, but is unsuitable for large-screen displays. Meanwhile, amorphous silicon TFTs are appropriate for manufacture of large-screen displays, so there have been efforts to improve the characteristics of OLEDs using such amorphous silicon TFTs. However, amorphous silicon may have only n-channel TFTs thereon. In this case, common OLEDS with lower anodes are allowed to be only at a source terminal of a driving TFT, which affects the stability of a source voltage that is dependent on a voltage drop of organic light-emitting materials.

To address these drawbacks, an inverted OLED with a reflective metal-based lower cathode and an indium tin oxide (ITO) anode on an organic layer has been suggested. However, the organic layer underlying the ITO cathode may be damaged during deposition of ITO thereon by sputtering. For this reason, an inverted OLED with an ITO-based lower cathode has been suggested, wherein a drain terminal of an n-channel TFT is connected directly to the cathode of the OLED, so that stability may be improved with a reduced driving voltage. However, this inverted structure using a high work function ITO as a cathode requires more efficient electron injection from ITO to the organic layer.

SUMMARY

One or more embodiments of the present invention provides an inverted organic light-emitting device and a normal organic light-emitting device each having an electron transport layer with improved electron injection characteristics and electron mobility.

Additional aspects of embodiments of the invention will be set forth in part in the description which follows and, in part, will be apparent from the description, or may be learned by practice of the presented embodiments.

According to one or more embodiments of the present invention, an organic light-emitting device includes: a substrate; a transparent cathode on the substrate; an anode arranged opposite to the cathode; an emission layer between the cathode and the anode; and a first electron transport layer between the cathode and the emission layer and including an imidazole derivative.

The cathode may include indium tin oxide (ITO), indium zinc oxide (IZO), zinc oxide (ZnO), aluminum-doped zinc oxide (AZO), indium oxide ($In_2O_3$), or tin oxide ($SnO_2$).

The first electron transport layer may include $Alq_3$ (tris(8-hydroxyquinolinato)aluminum), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tert-butylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1,O8)-(1,1'-biphenyl-4-olato)aluminum), Bebq2 (beryllium bis(benzoquinolin-10-olate), or ADN (9,10-di(naphthalene-2-yl)anthracene).

The imidazole derivative may be a DMBI (2,3-dihydro-1,3-dimethyl-2-phenyl-1H-benzo[d]imidazole) derivative.

The DMBI derivative may include DMBI, Cl-DMBI (2-(2,4-dichlorophenyl)-2,3-dihydro-1,3-dimethyl-1H-benzo[d]imidazole), N-DMBI (4-(2,3-dihydro-1,3-dimethyl-1H-benzo[d]imidazol-2-yl)-N,N-dimethylbenzenamine), or OH-DMBI (2-(2,3-dihydro-1,3-dimethyl-1H-benzo[d]imidazol-2-yl)phenol).

An amount of the imidazole derivative may be in a range of about 0.2 parts to about 20 parts by weight based on 100 parts by weight of the total weight of the first electron transport layer.

The anode may include a metal layer including silver (Ag), aluminum (Al), or gold (Au). The anode may further include a metal oxide layer including $MoO_3$, $V_2O_5$, or $WO_3$ (e.g., under the metal layer).

According to one or more embodiments of the present invention, an organic light-emitting device includes: a substrate; an anode on the substrate; a cathode arranged opposite to the anode; an emission layer between the anode and the cathode; and a first electron transport layer between the emission layer and the cathode and including an imidazole derivative.

The anode may include indium tin oxide (ITO), indium zinc oxide (IZO), zinc oxide (ZnO), aluminum-doped zinc oxide (AZO), indium oxide ($In_2O_3$), or tin oxide ($SnO_2$).

The first electron transport layer may include an electron transport layer forming material as described above (e.g., $Alq_3$, BCP, Bphen, TAZ, NTAZ, tBu-PBD, BAlq, Bebq2 or ADN).

The imidazole derivative may be a DMBI derivative. The DMBI derivative may include DMBI, Cl-DMBI, N-DMBI, or OH-DMBI.

An amount of the imidazole derivative may be in a range of about 0.2 parts to about 20 parts by weight based on 100 parts by weight of the total weight of the first electron transport layer.

The cathode may include lithium (Li), magnesium (Mg), aluminum (Al), aluminum-lithium (Al—Li), calcium (Ca), magnesium-indium (Mg—In), or magnesium-silver (Mg—Ag).

The organic light-emitting device may further include a hole transport layer or a hole injection layer between the anode and the emission layer.

The organic light-emitting device may further include a second electron transport layer between the first electron transport layer and the emission layer

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
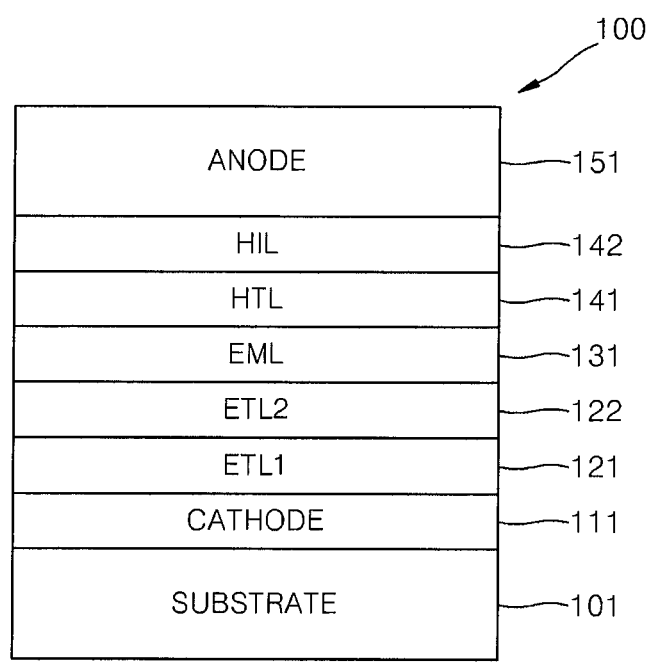
FIG. 1 is a schematic cross-sectional view of an organic light-emitting device (OLED) according to an embodiment of the present invention.

Reference will now be made in detail to the exemplary embodiments of the present general inventive concept, examples of which are illustrated in the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like numbers refer to like elements throughout. Also, in the context of the present application, when a first element is referred to as being "on" a second element, it can be directly on the second element or be indirectly on the second element with one or more intervening elements interposed therebetween.

FIG. 1 is a schematic cross-sectional view of an organic light-emitting device (OLED) according to an embodiment of the present invention.

The light-emitting device 100 is an inverted OLED including a substrate 101, a cathode 111, a first electron transport layer (ETL1) 121, a second electron transport layer (ETL2) 122, an emission layer (EML) 131, a hole transport layer (HTL) 141, a hole injection layer (HIL) 142, and an anode 151 that are sequentially positioned on one another.

The substrate 101 may be any substrate that is commonly used in general organic light-emitting devices. In some embodiments, the substrate 101 may be a glass substrate or a transparent plastic substrate with strong mechanical strength, thermal stability, transparency, surface smoothness, ease of handling, and water resistance, but the substrate is not limited thereto. Non-limiting examples of the transparent plastic substrate include polycarbonate (PC), poly(methyl methacrylate (PMMA), polyethylene terephthalate (PET), polyethylene (PE), polypropylene (PP), polyimide (PI), and polyethylene naphthalate (PEN).

The cathode 111 may be disposed on the substrate 101. The cathode 111 may be formed of a transparent conductive metal oxide. The cathode 111 may be formed of a transparent conductive oxide, for example, indium tin oxide (ITO), indium zinc oxide (IZO), zinc oxide (ZnO), aluminum-doped zinc oxide (AZO), indium oxide ($In_2O_3$), or tin oxide ($SnO_2$), but the cathode is not limited thereto. The cathode 111 of the transparent conductive oxide may be formed via, for example, evaporation deposition or sputtering. The cathode 111 may have a thickness in a range of, for example, about 300 Å to about 2,000 Å.

The first electrode transport layer 121 facilitates injection of electrons from the cathode 111 and may be on the cathode 111. The first electron transport layer 121 may include an electron-conducting host material, and an imidazole derivative as an n-dopant.

Non-limiting examples of the electron-conducting host of the first electron transport layer 121 include $Alq_3$ (tris(8-hydroxyquinolinato)aluminum), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tert-butylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1,O8)-(1,1-biphenyl-4-olato)aluminum), Bebq2 (beryllium bis(benzoquinolin-10-olate), and ADN (9,10-di(naphthalene-2-yl)anthracene).

Bphen as the electron-transporting host may be used, for example, as a Bphen:Li mixture, a Bphen:Cs mixture, or a Bphen:$Rb_2CO_3$ mixture.

The first electron transport layer may include an imidazole derivative as an n-dopant. Non-limiting examples of the imidazole derivative include DMBI (2,3-dihydro-1,3-dimethyl-2-phenyl-1H-benzo[d]imidazole), CI-DMBI (2-(2,4-dichlorophenyl)-2,3-dihydro-1,3-dimethyl-1H-benzo[d] imidazole), N-DMBI (4-(2,3-dihydro-1,3-dimethyl-1H-benzo[d]imidazol-2-yl)-N,N-dimethylbenzenamine), and OH-DMBI (2-(2,3-dihydro-1,3-dimethyl-1H-benzo[d]imidazol-2-yl)phenol).

When being spin-coated on the cathode 111 along with an electron transporting host material to form an electron transport layer and thermally treated, the imidazole derivative may generate radicals. For example, thermal treatment of N-DMBI may release hydrogen at the number 2 position of benzoimidazole of N-DMBI, regenerating free radicals, as illustrated below.

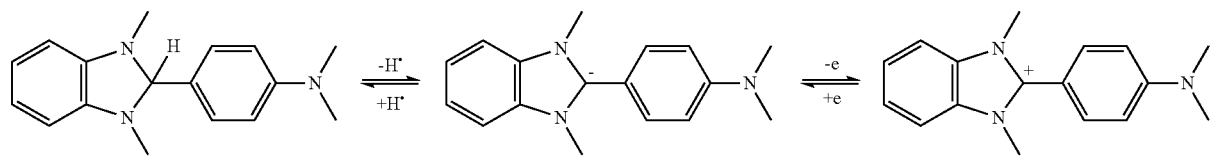

Once radicals are generated, a highest occupied molecular orbital (HOMO) level of the N-DMBI may be increased from about −4.67 eV to about −2.36 eV, which may facilitate injection of electrons from the HOMO level of N-DMBI radical into the second electron transport layer. For example, the N-DMBI radicals may more effectively serve as an n-dopant.

An amount of the imidazole derivative may be in a range of about 0.2 parts to about 20 parts by weight, and in some embodiments, in a range of about 0.5 parts to about 10 parts by weight, and in some other embodiments, in a range of about 1 part to 5 parts by weight, and in still other embodiments, in a range of 2 parts to about 3 parts by weight, based on about 100 parts by weight of a total weight of the first electron transport layer 121.

The imidazole derivative is stable in air before being subjected to the thermal treatment for generating radicals, and thus may be compatible with a solution process. Thus, the first electron transport layer 121 containing the imidazole derivative may be formed through a solution process in air, so that the overall process may be simplified, and an organic light-emitting device that is stable in air may be implemented. Furthermore, since the imidazole derivative in the first electron transport layer 121 serves as an n-dopant, electron injection characteristics may be improved with increased electron mobility, and thus characteristics of the organic light-emitting device may be improved.

The first electron transport layer 121 may have a thickness in a range of about 200 Å to about 400 Å, and in some embodiments, in a range of about 250 Å to 350 Å. When the thickness of the first electron transport layer is within the foregoing ranges, satisfactory hole injection characteristics may be obtained without a substantial decrease in driving voltage.

The second electron transport layer 122 may be on the first electron transport layer 121. Non-limiting examples of materials for the second electron transport layer 122 include $Alq_3$, TPBi(1,3,5-Tri(1-phenyl-1H-benzo[d]imidazol-2-yl)phenyl), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tert-butylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1,O8)-(1,1-biphenyl-4-olato)aluminum), Bebq2 (beryllium bis(benzoquinolin-10-olate), and ADN (9,10-di(naphthalene-2-yl)anthracene).

The second electron transport layer 122 may be formed by using, for example, vacuum deposition, spin coating, casting, or Langmuir-Blodgett (LB) deposition.

When the second electron transport layer 122 is formed using vacuum deposition, the deposition conditions may vary depending on the compound that is used to form the second electron transport layer 122, and the characteristics of the second electron transport layer 122 to be formed. For example, the deposition conditions may be appropriately selected from the following ranges: a temperature in a range of about 100° C. to about 500° C., a pressure in a range of about $10^{-8}$ torr to about $10^{-3}$ torr, and a deposition rate in a range of about 0.01 Å/sec to about 100 Å/sec.

When the second electron transport layer 122 is formed using spin coating, the coating condition may vary depending on the compound that is used to form the second electron transport layer 122 and the characteristics of the second electron transport layer 122 to be formed. For example, the coating conditions may be appropriately selected from the following ranges: a coating rate in a range of about 2000 rpm to about 5000 rpm and a heat treatment temperature in a range of about 80° C. to 200° C. for removing a solvent after coating.

The first electron transport layer 122 may have a thickness in a range of about 200 Å to about 400 Å, and in some embodiments, in a range of about 250 Å to 350 Å. When the thickness of the second electron transport layer is within the foregoing ranges, satisfactory hole injection characteristics may be obtained without a substantial decrease in driving voltage.

In some embodiments, the second electron transport layer 122 may further include a metal-containing material. The metal-containing material may include, for example, a lithium (Li) complex. A non-limiting example of the Li complex is lithium quinolate (LiQ).

When a phosphorescent dopant is used to form the emission layer 131, a hole blocking layer (HBL) (not shown) may be formed between the emission layer 131 and the second electron transport layer 122 by using vacuum deposition, spin coating, casting, Langmuir-Blodgett (LB) deposition, or the like, in order to prevent or reduce diffusion of triplet excitons or holes into the second electron transport layer. When the hole blocking layer is formed using vacuum deposition or spin coating, the deposition and coating conditions may be similar to those for the formation of the second electron transport layer 122, though the deposition and coating conditions may vary depending on the compound that is used to form the hole blocking layer. Non-limiting examples of the hole blocking material include an oxadiazole derivative, a triazole derivative, and a phenanthroline derivative. For example, BCP may be used as a material for forming the hole blocking layer.

A thickness of the hole blocking layer may be in a range of about 50 Å to about 1000 Å, and in some embodiments, may be in a range of about 100 Å to about 300 Å. When the thickness of the hole blocking layer is within the foregoing ranges, the device may have improved hole blocking ability without a substantial increase in driving voltage.

Afterward, the emission layer 131 may be formed on the second electron transport layer 122, or hole blocking layer (not shown) by using vacuum deposition, spin coating, casting, Langmuir-Blodget (LB) deposition, or the like. When the emission layer 131 is formed using vacuum deposition or spin coating, the deposition and coating conditions may be similar to those for the formation of the second electron transport layer 122, though the conditions for deposition and coating may vary depending on the compound that is used to form the EML.

A material for the emission layer 131 may be at least one selected from among suitable light-emitting materials (including hosts and dopants).

Non-limiting examples of the host include $Alq_3$ (tris(8-quinolinolate)aluminum), CBP (4,4'-bis(N-carbazolyl)-1,1'-biphenyl), PVK (poly(n-vinylcabazole), ADN (9,10-di(naphthalene-2-yl)anthracene), TCTA (4,4',4"-Tris(carbazol-9-yl)-triphenylamine), TPBI (1,3,5-tris(N-phenylbenzimidazole-2-yl)benzene), TBADN (3-tert-butyl-9,10-di(naphth-2-yl) anthracene, DSA (distyrylarylene), E3, or CDBP (4,4'-bis(9-carbazolyl)-2,2'-dimethyl-biphenyl.

The dopant may be any suitable dopant, for example, at least one of a fluorescent dopant and a phosphorescent dopant. For example, the phosphorescent dopant may include, but is not limited to, an organometallic complex including at least one selected from the group consisting of iridium (Ir), platinum (Pt), osmium (Os), rhenium (Re), titanium (Ti), zirconium (Zr), hafnium (Hf), and a combination of at least two thereof.

Non-limiting examples of red dopants are PtOEP (Pt(II) octaethylporphine, Ir(piq)$_3$ (tris(2-phenylisoquinoline)iridium, Btp$_2$Ir(acac) (bis(2-(2'-benzothienyl)-pyridinato-N, C3')iridium(acetylacetonate), and bis(2-(2-benzothienyl)-pyridinato-N,C3)iridium(acetylaetonate).

Non-limiting examples of green dopants include Ir(ppy)$_3$ (tris(2-phenylpyridine) iridium), Ir(ppy)$_2$(acac) (bis(2-phenylpyridine)(acetylacetonato)iridium(III), Ir(mppy)$_3$ (tris(2-(4-tolyl)phenylpiridine)iridium), and C545T (10-(2-benzothiazolyl)-1,1,7,7-tetramethyl-2,3,6,7-tetrahydro-1H,5H,11H-Mbenzopyrano[6,7,8-ij]-quinolizin-11-one).

Non-limiting examples of widely known blue dopants include F$_2$Irpic (bis[3,5-difluoro-2-(2-pyridyl)phenyl](picolinato)iridium(III)), (F$_2$ppy)$_2$Ir(tmd), Ir(dfppz)$_3$, DPVBi (4,4'-bis(2,2'-diphenylethen-1-yl)biphenyl), DPAVBi (4,4'-bis[4-(diphenylamino)styryl]biphenyl), and TBPe (2,5,8,11-tetra-tert-butyl perylene).

When the emission layer 131 includes both a host and a dopant, the amount of the dopant may be in a range of about 0.01 parts to about 15 parts by weight based on 100 parts by weight of the host. However, the amount of the dopant is not limited to this range.

A thickness of the emission layer 131 may be in a range of about 100 Å to about 1000 Å, and in some embodiments, may be in a range of about 200 Å to about 600 Å. When the thickness of the emission layer is within these ranges, the device may have good light emitting ability without a substantial increase in driving voltage.

The hole transport layer 141 may be disposed on the emission layer 131. Non-limiting examples of hole transporting materials include carbazole derivatives, such as N-phenylcarbazole, polyvinylcarbazole, or the like; triphenylamine materials, such as TPD (N,N'-bis(3-methylphenyl)-N,N'-diphenyl-[1,1-biphenyl]-4,4'-diamine); NPB (N,N'-di(1-naphthyl)-N,N'-diphenylbenzidine), and TCTA (4,4',4"-tris(N-carbazolyl)triphenylamine).

A thickness of the hole transport layer 141 may be in a range of about 50 Å to about 1000 Å, and in some embodiments, may be in a range of about 100 Å to about 800 Å. When the thickness of the hole transport layer 141 is within the foregoing ranges, the device may have satisfactory electron transporting ability without a substantial increase in driving voltage.

The hole transport layer 141 may be formed by using, for example, vacuum deposition, spin coating, casting, or Langmuir Blodgett (LB) deposition. When the hole transport layer is formed using vacuum deposition or spin coating, the conditions for deposition and coating may be similar to those for the formation of the second electron transport layer, though the conditions for the deposition and coating may vary according to the material that is used to form the hole transport layer.

The hole injection layer 142 may be on the hole transport layer 141. Non-limiting examples of a material for the hole injection layer 142 include phthalocyanine compounds such as copper phthalocyanine; DNTPD (N,N'-diphenyl-N,N'-bis-[4-(phenyl-m-tolyl-amino)-phenyl]-biphenyl-4,4-diamine), m-MTDATA (4,4',4"-tris(3-methylphenylphenylamino) triphenylamine), TDATA (4,4',4"-Tris(N,N-diphenylamino) triphenylamine), 2T-NATA (4,4',4"-tris{N,-(2-naphthyl)-N-phenylamino}-triphenylamine), PEDOT/PSS (poly(3,4-ethylenedioxythiophene)/poly(4-styrenesulfonate)), PANI/DBSA (polyaniline/dodecylbenzenesulfonic acid), PANI/CSA (polyaniline/camphor sulfonic acid), or PANI/PSS ((polyaniline)/poly(4-styrenesulfonate)).

The hole injection layer 142 may be formed by using any of a variety of suitable methods, for example, vacuum deposition, spin coating, casting, or LB deposition.

When the hole injection layer 142 is formed using vacuum deposition or spin coating, the deposition and coating conditions may be similar to those for the formation of the second electron transport layer 122, though the deposition and coating conditions may vary according to a material that is used to form the hole injection layer 142.

A thickness of the hole injection layer 142 may be in a range of about 100 Å to about 10,000 Å, and in some embodiments, may be in a range of about 100 Å to about 1,000 Å. When the thickness of the hole injection layer 142 is within the foregoing ranges, the device may have satisfactory hole injecting ability without a substantial decrease in a driving voltage.

A hole functional layer (not shown; hereinafter), instead of the hole transport layer 141 and the hole injection layer 142, may be on the emission layer. The hole functional layer may include at least one material selected from each group of the hole injection layer materials and hole transport layer materials described above. A thickness of the hole functional layer may be in a range of about 500 Å to about 10,000 Å, and in some embodiments, may be in a range of about 100 Å to about 1,000 Å. When the thickness of the H-functional layer is within the foregoing ranges, the device may have good hole injection and transport capabilities without a substantial increase in driving voltage.

At least one of the hole injection layer 142, the hole transport layer 141, and the hole functional layer may further include a charge-generating material for improved layer conductivity, in addition to the hole injecting material, hole transport material, and/or material having both hole injection and hole transport capabilities as described above.

The charge generating material may be, for example, a p-dopant. Non-limiting examples of the p-dopant include quinone derivatives such as tetracyanoquinonedimethane (TCNQ), 2,3,5,6-tetrafluoro-tetracyano-1,4-benzoquinonedimethane (F4TCNQ), and the like; metal oxides such as tungsten oxide, molybdenum oxide, and the like; and cyano-containing compounds.

When the hole injection layer, hole transport layer, or hole functional layer further includes a charge-generating material, the charge-generating material may be dispersed in these layers in any of a variety of patterns to be, for example, homogeneous or inhomogeneous, or to have a concentration gradient.

The anode 151 may be on the hole injection layer 142 or the hole functional layer. The anode 151 may be formed, for example, as a double layer including a metal oxide layer including MoO$_3$, V$_2$O$_5$, or WO$_3$, and a metal layer including Ag, Al, or Au.

The anode 151 may be formed, for example, by using evaporation deposition. A thickness of the metal oxide layer of the anode 151 may be in a range of about 30 Å to about 50 Å, and a thickness of the metal layer of the anode 151 may be in a range of about 1,000 Å to about 1,300 Å.

Figure 2:
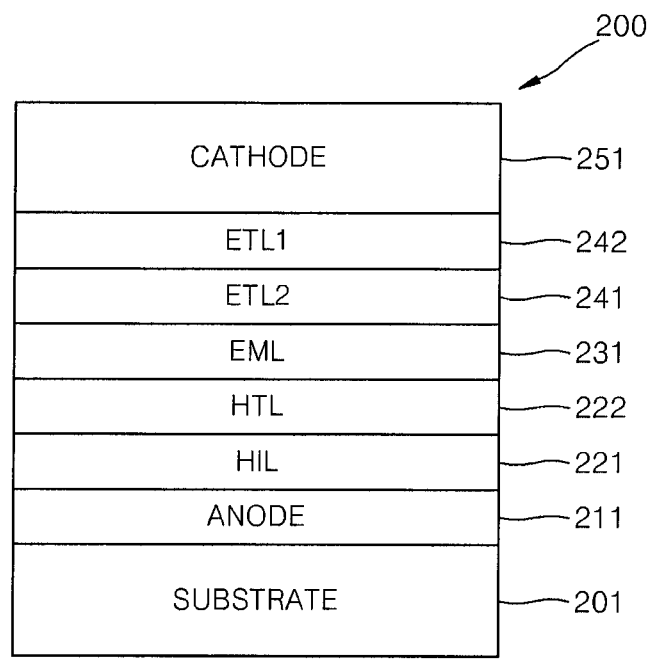
FIG. 2 is a schematic cross-sectional view of an OLED according to an embodiment of the present invention.

FIG. 2 is a schematic cross-sectional view of an OLED 200 according to an embodiment of the present invention. The OLED 200 of FIG. 2 is a standard OLED, which is arranged differently from the inverted OLED 100 of FIG. 1. Referring to FIG. 2, the OLED 200 includes a substrate 201, an anode 211, a hole injection layer (HIL) 221, a hole transport layer (HTL) 222, an emission layer (EML) 231, a second electron transport layer (ETL2) 241, a first electron transport layer (ETL1) 242, and a cathode 251 that are sequentially on one another. The order of the layers on the substrate 201 of the OLED 200 is in reverse (e.g., the inverse) with respect to that in the OLED 100 of FIG. 1.

In some embodiments, the hole injection layer 221, the hole transport layer 222, the emission layer 231, the second electron transport layer 241, and the first electron transport layer 242 of the OLED 200 may be formed of the same materials as the hole injection layer 142, the hole transport layer 141, the emission layer 131, the second electron transport layer 122, and the first electron transport layer 121, respectively. The OLED 200 of FIG. 2 will be described focusing on the anode 211 and the cathode 251, which are different from the OLED 100 of FIG. 1.

The anode 211 may be formed of a material having a relatively high work function. The anode 211 may be formed of a transparent conductive oxide, for example, indium tin oxide (ITO), indium zinc oxide (IZO), zinc oxide (ZnO), aluminum-doped zinc oxide (AZO), indium oxide ($In_2O_3$), or tin oxide ($SnO_2$), but the anode is not limited thereto. The anode 211 may be formed by using vacuum deposition or sputtering. The anode 211 may have a thickness in a range of, for example, about 300 Å to about 2,000 Å.

The cathode 251 may be formed of a metal, an alloy, or an electrically conductive compound, which are materials having a low work function, or a mixture of at least two thereof. In this regard, the cathode 251 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting device, the transmission electrode may be formed using indium tin oxide (ITO) or indium zinc oxide (IZO).

Similar to the first electron transport layer 121 of the OLED of FIG. 1, the first electron transport layer 242 of FIG. 2 may contain an imidazole derivative as an n-dopant. When being spin-coated on the second electron transport layer 241 along with an electron transporting host material and then thermally treated, the imidazole derivative may generate radicals and have a higher HOMO energy level. Accordingly, the electrons from the HOMO level of the imidazole derivative radicals may be easily injected into the second electron transport layer 241. Thus, the imidazole derivative may more effectively function as an n-dopant.

The one or more embodiments of the present invention may be applicable to OLEDs in any of a variety of structures, for example, a mono-color type OLED, a multi-color type OLED, or white-color type OLED.

Example 1

An ITO-coated glass substrate was cut to a size of 50 mm×50 mm×0.7 mm, and then ultrasonically cleaned with alcohol and then pure water, each for 5 minutes, to prepare the cathode layer on the glass substrate.

A solution of 0.5 wt % of Merck Green (SPG-01T, Merck Advanced Technologies Limited) and 0.005 wt % of N-DMBI (1 wt % with respect to the weight of Merck Green) dissolved in toluene was prepared. This solution was spin-coated on the ITO glass substrate to form a first electron transport layer containing a mixture of Merck Green: N-DMBI (about 1 wt %) to have a thickness of about 30 nm.

A TPBi layer having a thickness of about 30 nm was formed by thermal deposition on the first electron transport layer containing Merck Green and N-DMBI to form a second electron transport layer.

CBP containing 8 wt % of Ir(ppy)$_3$ was vacuum-deposited on the TPBi layer to form an emission layer including an Ir(ppy)$_3$:CBP layer having a thickness of about 10 nm. Afterward, a hole transport layer including a CBP layer having a thickness of about 15 nm was formed on the Ir(ppy)$_3$:CBP layer.

A TCTA layer having a thickness of about 35 nm was formed via thermal deposition as a hole injection layer on the CBP layer, followed by vacuum thermal deposition of MoO$_3$ on the TCTA layer to a thickness of about 1 nm and then Ag to a thickness of about 100 nm.

As a result, an OLED including ITO (cathode)/Merck Green:N-DMBI (30 nm, 1 wt % of N-DMBI)(first electron transport layer)/TPBi (30 nm)(second electron transport layer)/Ir(ppy)$_3$:CBP (10 nm, 8 wt % of Ir(ppy)$_3$)(emission layer)/CBP (15 nm)(hole transport layer)/TCTA (35 nm) (hole injection layer)/MoO$_3$(1 nm):Ag(100 nm)(anode) was manufactured.

Example 2

An OLED was manufactured in the same manner as in Example 1, except that 3 wt % of N-DMBI, instead of 1 wt % of N-DMBI, was used in forming the first electron transport layer.

Example 3

An OLED was manufactured in the same manner as in Example 1, except that 5 wt % of N-DMBI, instead of 1 wt % of N-DMBI, was used in forming the first electron transport layer.

Example 4

An OLED was manufactured in the same manner as in Example 1, except that 10 wt % of N-DMBI, instead of 1 wt % of N-DMBI, was used in forming the first electron transport layer.

Comparative Example 1

An OLED was manufactured in the same manner as in Example 1, except that N-DMBI was not used in forming the first electron transport layer.

Electrical Characteristics

Figure 3:
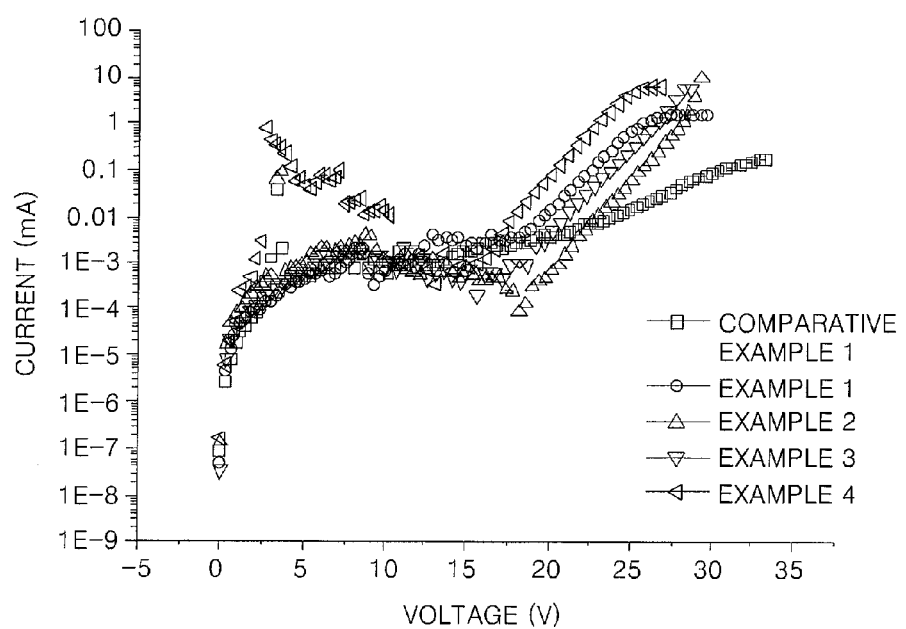
FIG. 3 is a graph of current with respect to voltage of OLEDs of Examples 1 to 4 and an OLED of Comparative Example 1.

FIG. 3 is a graph of current with respect to voltage of OLEDs of Examples 1 to 4 and an OLED of Comparative Example 1. Referring to FIG. 3, a turn-on voltage is found to become lower with an increasing concentration of the N-DMBI dopant.

Figure 4:
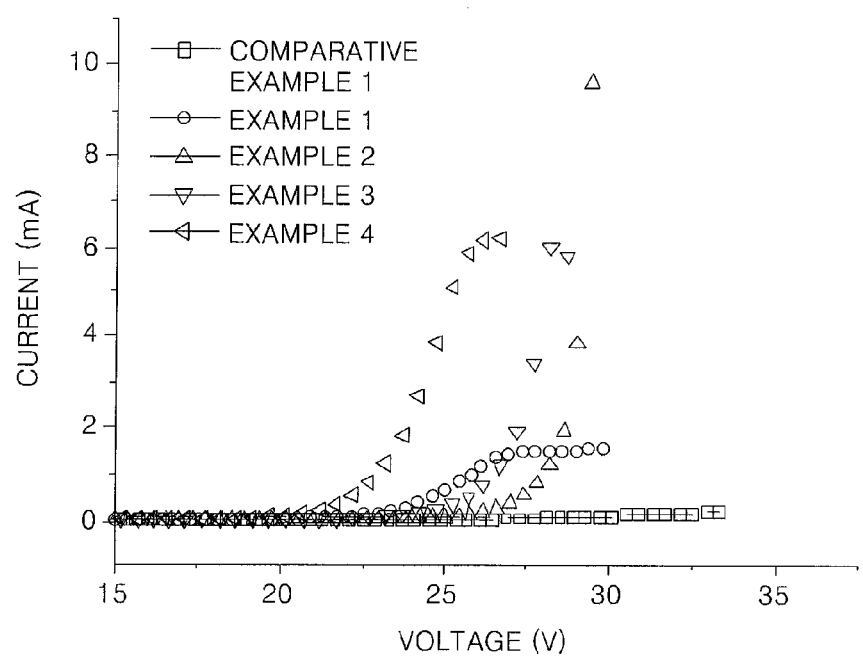
FIG. 4 is a magnified graph of a region with an application voltage of 15V to 33V in the graph of FIG. 3.

FIG. 4 is a magnified graph of a region with an applied voltage of 15 V to 33 V in the graph of FIG. 3. Referring to FIG. 4, a current level at the same voltage was high in the order of Example 4, Example 3, Example 2, and Comparative Example 1, and the turn-on voltage at which current flows to start was low in the same order of the examples, excluding Example 1.

Figure 5:
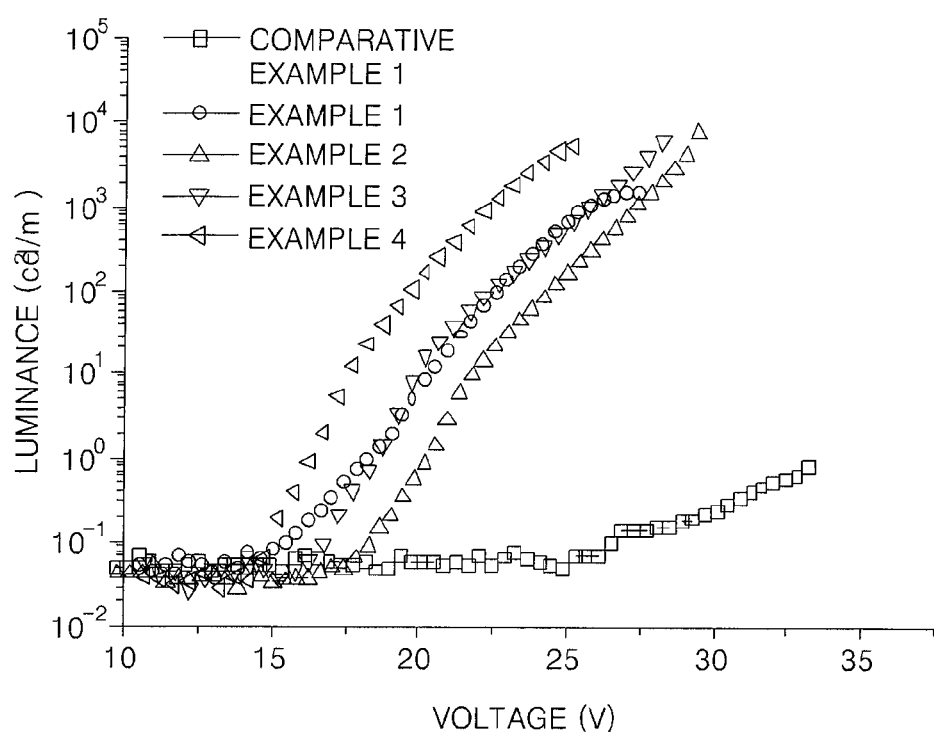
FIG. 5 is a graph of luminance with respect to voltage of the OLEDs of Examples 1 to 4 and the OLED of Comparative Example 1.

FIG. 5 is a graph of luminance with respect to voltage of the OLEDs of Examples 1 to 4 and an OLED of Comparative Example 1. Similar to the current versus voltage graph of FIG. 3, luminance was high in the order of Example 4, Example 3, Example 2, and Comparative Example 1, with the exclusion of Example 1.

Figure 6:
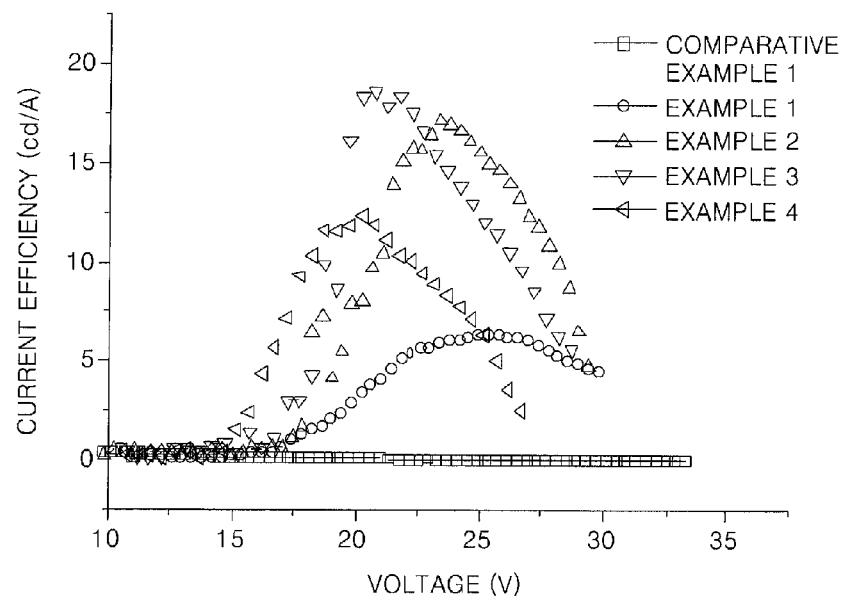
FIG. 6 is a graph of current efficiency with respect to voltage of the OLEDs of Examples 1 to 4 and the OLED of Comparative Example 1.

FIG. 6 is a graph of current efficiency with respect to voltage of the OLEDs of Examples 1 to 4 and the OLED of Comparative Example 1. A current efficiency (Cd/A) was determined as luminance per unit current. Referring to the graph of FIG. 6, luminance efficiency was found to be higher in the order of Example 3, Example 2, Example 4, Example 1, and Comparative Example 1.

Referring to the graphs of FIGS. 4 to 6, the OLEDs of Examples 1 to 4 including N-DMBI in the first electron transport layer are found to have greater improvements over the OLED of Comparative Example 1, in terms of current versus voltage characteristics, luminance versus voltage characteristics, and current efficiency versus voltage characteristics.

Referring to the graphs of FIGS. 4 and 5, current and luminance levels are found to become higher at the same voltage with an increasing content of N-DMBI in the first electron transport layer contacting the cathode. This is attributed to the charge balance between electrons and holes induced due to the facilitated injection of electrons along with the increasing content of N-DMBI in the first electron transport layer. Referring to the graph of FIG. 6, the OLED of Example 3 is found to have the highest current efficiency, which is thought to be attributed to the charge balance between electrons and holes, and in particular, as compared with the OLED of Example 4 which is thought to be with a lower charge balance due to the predominance of electrons.

Figure 7:
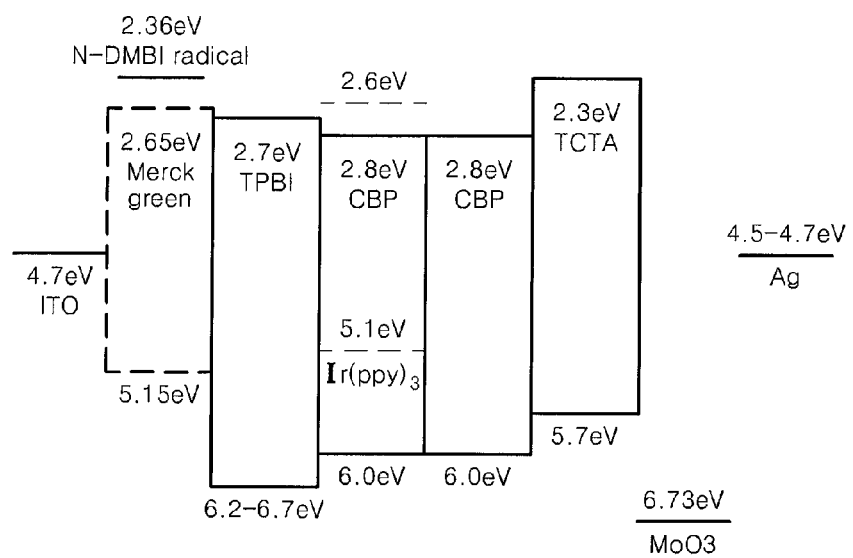
FIG. 7 is an energy band diagram of the organic light-emitting devices of Examples 1 to 4.

FIG. 7 is an energy band diagram of the organic light-emitting devices of Examples 1 to 4. Referring to FIG. 7, the N-DMBI radicals as an n-dopant are found to have a HOMO energy level of 2.36V, which may further facilitate injection of electrons into the second electron transport layer.

As described above, according to the one or more of the above embodiments of the present invention, an inverted organic light-emitting device and a standard organic light-emitting device includes an electron transport layer in contact with a cathode, the electron transport layer containing an imidazole derivative stable in the air as an n-dopant, so that forming the electron transport layer on the cathode via a liquid process may be facilitated, and further the electron transport layer may have improved electron injection characteristics and electron mobility, thus improving characteristics of the organic light-emitting device.

It should be understood that the exemplary embodiments described herein should be considered in a descriptive sense and not for purposes of limitation. Descriptions of features or aspects within each embodiment should typically be considered as available for other similar features or aspects in other embodiments. The present application is intended to cover various modifications and equivalent arrangements included within the spirit and scope of the appended claims, and equivalents thereof.

What is claimed is:

1. An organic light-emitting device comprising:
a substrate;
a transparent cathode on the substrate;
an anode disposed opposite to the cathode;
an emission layer between the cathode and the anode; and
a first electron transport layer between the cathode and the emission layer and comprising a DMBI (2,3-dihydro-1,3-dimethyl-2-phenyl-1H-benzo[d]imidazole) derivative.

2. The organic light-emitting device of claim 1, wherein the cathode comprises indium tin oxide (ITO), indium zinc oxide (IZO), zinc oxide (ZnO), aluminum-doped zinc oxide (AZO), indium oxide ($In_2O_3$), or tin oxide ($SnO_2$).

3. The organic light-emitting device of claim 1, wherein the first electron transport layer further comprises $Alq_3$ (tris(8-hydroxyquinolinato)aluminum), BCP (2,9-dimethyl-4,7-diphenyl-1,10-phenanthroline), Bphen (4,7-diphenyl-1,10-phenanthroline), TAZ (3-(4-biphenylyl)-4-phenyl-5-tert-butylphenyl-1,2,4-triazole), NTAZ (4-(naphthalen-1-yl)-3,5-diphenyl-4H-1,2,4-triazole), tBu-PBD (2-(4-biphenylyl)-5-(4-tert-butylphenyl)-1,3,4-oxadiazole), BAlq (bis(2-methyl-8-quinolinolato-N1,O8)-(1,1'-biphenyl-4-olato)aluminum), Bebq2 (beryllium bis(benzoquinolin-10-olate), or ADN (9,10-di(naphthalene-2-yl)anthracene).

4. The organic light-emitting device of claim 1, wherein the DMBI derivative comprises DMBI, Cl-DMBI (2-(2,4-dichlorophenyl)-2,3-dihydro-1,3-dimethyl-1H-benzo[d]imidazole), N-DMBI (4-(2,3-dihydro-1,3-dimethyl-1H-benzo[d]imidazol-2-yl)-N,N-dimethylbenzenamine), or OH-DMBI (2-(2,3-dihydro-1,3-dimethyl-1H-benzo[d]imidazol-2-yl)phenol).

5. The organic light-emitting device of claim 1, wherein an amount of the DMBI derivative is in a range of about 0.2 parts to about 20 parts by weight based on 100 parts by weight of a total weight of the first electron transport layer.

6. The organic light-emitting device of claim 1, further comprising a second electron transport layer between the first electron transport layer and the emission layer.

7. The organic light-emitting device of claim 6, further comprising a hole blocking layer between the second electron transport layer and the emission layer.

8. The organic light-emitting device of claim 1, further comprising a hole transport layer or a hole injection layer between the emission layer and the anode.

9. The organic light-emitting device of claim 1, wherein the anode comprises a metal layer including silver (Ag), aluminum (Al), or gold (Au).

10. The organic light-emitting device of claim 1, wherein the anode further comprises a metal oxide layer contacting the metal layer, the metal oxide layer comprising $MoO_3$, $V_2O_5$, or $WO_3$.

11. An organic light-emitting device comprising:
a substrate;
an anode on the substrate;
a cathode disposed opposite to the anode;
an emission layer between the anode and the cathode; and
a first electron transport layer between the emission layer and the cathode and comprising a DMBI (2,3-dihydro-1,3-dimethyl-2-phenyl-1H-benzo[d]imidazole) derivative.

12. The organic light-emitting device of claim 11, wherein the anode comprises indium tin oxide (ITO), indium zinc oxide (IZO), zinc oxide (ZnO), aluminum-doped zinc oxide (AZO), indium oxide ($In_2O_3$), or tin oxide ($SnO_2$).

13. The organic light-emitting device of claim 11, wherein the first electron transport layer further comprises $Alq_3$, BCP, Bphen, TAZ, NTAZ, tBu-PBD, BAlq, Bebq2, or ADN.

14. The organic light-emitting device of claim 11, wherein the DMBI derivative comprises DMBI, Cl-DMBI, N-DMBI, or OH-DMBI.

15. The organic light-emitting device of claim 11, wherein an amount of the DMBI derivative is from about 0.2 parts to about 20 parts by weight based on 100 parts by weight of a total weight of the first electron transport layer.

16. The organic light-emitting device of claim 11, wherein the cathode comprises lithium (Li), magnesium (Mg), aluminum (Al), aluminum-lithium (Al—Li), calcium (Ca), magnesium-indium (Mg—In), or magnesium-silver (Mg—Ag).

17. The organic light-emitting device of claim 11, further comprising a hole transport layer or a hole injection layer between the anode and the emission layer.

18. The organic light-emitting device of claim 11, further comprising a second electron transport layer between the first electron transport layer and the emission layer.

* * * * *